United States Patent [19]
Kawada et al.

[11] Patent Number: 5,638,439
[45] Date of Patent: Jun. 10, 1997

[54] ADAPTIVE FILTER AND ECHO CANCELLER

[75] Inventors: Shinichi Kawada; Kenichi Shindate, both of Tokyo, Japan

[73] Assignee: Oki Electric Industry Co., Ltd., Tokyo, Japan

[21] Appl. No.: 616,962

[22] Filed: Mar. 15, 1996

[30] Foreign Application Priority Data

Mar. 20, 1995 [JP] Japan ................................ 7-060909

[51] Int. Cl.$^6$ ................................ H04B 3/20; H04M 9/08
[52] U.S. Cl. ........................ 379/411; 379/410; 370/290; 364/724.19
[58] Field of Search ........................ 379/406, 410, 379/411; 375/14; 364/724.19, 825, 724.2; 370/32.1

[56] References Cited

U.S. PATENT DOCUMENTS

| | | | |
|---|---|---|---|
| 4,408,332 | 10/1983 | Sari | 375/14 |
| 4,989,170 | 1/1991 | Batruni et al. | 364/724.19 |
| 5,192,918 | 3/1993 | Sugiyama | 328/165 |
| 5,245,561 | 9/1993 | Sigiyama | 384/724.19 |
| 5,272,695 | 12/1993 | Makino et al. | 370/32.1 |
| 5,323,459 | 6/1994 | Hirano | 379/390 X |
| 5,329,472 | 7/1994 | Sugiyama | 364/724.19 |
| 5,371,789 | 12/1994 | Hirano | 379/410 |
| 5,390,364 | 2/1995 | Webster et al. | 364/724.2 X |
| 5,408,530 | 4/1995 | Makino et al. | 379/392 |
| 5,428,562 | 6/1995 | Gay | 364/724.19 |
| 5,475,632 | 12/1995 | Sugiyama | 364/825 |
| 5,517,435 | 5/1996 | Sugiyama | 364/724.19 |
| 5,526,426 | 6/1996 | McLaughlin | 379/411 |

FOREIGN PATENT DOCUMENTS 5-304444  11/1993  Japan.

OTHER PUBLICATIONS

Shoji Makino and Nobuo Koizumi, Improvement on Adaptation of an Echo Canceller in a Room, Mar. 1989, pp. 15–21, NTT Human Interface Laboratories.

Shoji Makino and Yutaka Kaneda, Exponentially Weighted Step-Size NLMS Adaptive Filter Based on the Statistics of a Room Impulse Response, pp. 9–20, Apr. 8, 1992, NTT Human Interface Laboratories.

Primary Examiner—Krista M. Zele
Assistant Examiner—Devendra T. Kumar
Attorney, Agent, or Firm—Rabin, Champagne & Lynt, P.C.

[57] ABSTRACT

An adaptive filter in the form of an FIR or IIR filter performs an adaptive filtering process relative to an input signal using a plurality of tap coefficients. The adaptive filter derives a vector formed by absolute values of the plurality of tap coefficients and weights step sizes of the plurality of tap coefficients using the first vector. The adaptive filter updates the plurality of tap coefficients based on the weighted step sizes. With this arrangement, the optimum tap coefficients can be achieved with high convergence speed. The adaptive filter is applicable to an echo canceller, such as, an acoustic echo canceller or a line echo canceller, so that echo canceling is effectively achieved by updating the tap coefficients with high accuracy and with high speed.

10 Claims, 2 Drawing Sheets

ADAPTIVE FILTER AND ECHO CANCELLER

BACKGROUND OF THE INVENTION

1. Field of the Invention

The present invention relates to an adaptive filter and an echo canceller, and particularly relates to updating of tap coefficients thereof.

2. Description of the Prior Art

In recent years, acoustic echo cancellers, line echo cancellers and the like have been researched and developed, wherein adaptive filters are used to produce echo replicas so as to cancel the echoes.

Techniques of these echo cancellers are described, for example, in the following publications:

Lit. 1: Electronic Information Communication Association Technical Research Report: April, 1989, EA89-3, entitled "Improvement on Adaptation of an Echo Canceller in a Room"

Lit. 2: Electronic Information Communication Association Technical Research Report: August, 1992, EA92-48, entitled "Exponentially Weighted Step-Size NLMS Adaptive Filter Based on the Statistics of a Room Impulse Response"

Lit. 3: Japanese First (unexamined) Patent Publication No. 5-304444 entitled "Unknown System Identification Method and Apparatus"

The acoustic echo cancellers in this literature use, in general, the learning identification method as one of the adaptive algorithms for achieving the echo canceling.

In each of the foregoing techniques, it is assumed that a room impulse response from a loudspeaker to a microphone is determined in advance. However, in practice, the room impulse response varies depending on the size and state of the room, materials of the room walls, and further, arrangements of the loudspeaker, the microphone and the like. The adaptive filter using the learning identification method of the conventional technique is not sufficiently adaptive to such impulse response variation, on a practical basis.

Although the conventional adaptive filter may be effective for the acoustic echo canceller to some degree, It is not effective for the line echo canceller, which is used at a place where a transmission line delay and an echo signal coexist. The line echoes differ depending on the places of observation where the echo cancellers are provided, and further, in general, the transmission line delay exists before the presence of the actual echo, and in addition, it is frequent that the transmission delay differs depending on the state of the line connection. For this reason, it has been very difficult to suppress such echos using the conventional adaptive filter.

Further, in the foregoing publication enumerated as Lit. 3, the disclosed step size controller cannot achieve the quick adaptation of tap coefficients, and thus cannot achieve a quick echo cancellation, when the echo waveform or echo time changes.

SUMMARY OF THE INVENTION

Therefore, it is an object of the present invention to provide an improved adaptive filter to be used in an acoustic echo canceller, a line echo canceller or the like, which is capable of achieving echo cancellation with high accuracy and with high convergence speed, even if a transmission line delay and an echo signal coexist and change.

It is another object of the present invention to provide an improved echo canceller incorporating such an improved adaptive filter.

According to one aspect of the present invention, an adaptive filter in the form of either an FIR filter or an IIR filter, for performing an adaptive filtering process relative to an input signal using a plurality of tap coefficients, comprises tap coefficient updating means including means for deriving a first vector formed by absolute values of the plurality of tap coefficients, and means for weighting step sizes of the plurality of tap coefficients using the first vector and for deriving a plurality of new tap coefficients based on the weighted step sizes.

It may be arranged that the tap coefficient updating means multiplies the first vector by a given constant which determines an updating rate of the step sizes, the tap coefficient updating means weighting the step sizes based on a result of the multiplication.

It may be arranged that the tap coefficient updating means adds a second vector to the first vector, the second vector determining initial weighting of the step sizes at the start of operation, and that the tap coefficient updating means weights the step sizes based on a result of the addition.

It may be arranged that the tap coefficient updating means adds a second vector to the result of the multiplication, the second vector determining initial weighting of the step sizes at the start of operation, and that the tap coefficient updating means weights the step sizes based on a result of the addition.

According to another aspect of the present invention, an echo canceller comprises an adaptive filter in the form of either an FIR filter or a IIR filter for performing an adaptive filtering process relative to an input signal using a plurality of tap coefficients, the adaptive filter estimating an echo caused by one of signal transmission and signal reception, so as to output an echo replica signal, and removing means for removing the echo replica signal from the input signal so as to output a remainder signal, wherein the adaptive filter derives a first vector formed by absolute values of the plurality of tap coefficients and weights step sizes of the plurality of tap coefficients using the first vector, and wherein the adaptive filter updates the plurality of tap coefficients using the remainder signal and the step sizes weighted so as to correct the echo replica signal.

It may be arranged that the adaptive filter multiplies the first vector by a given constant which determines an updating rate of the step sizes, and that the adaptive filter weights the step sizes based on a result of the multiplication.

It may be arranged that the adaptive filter adds a second vector to the first vector, the second vector determining initial weighting of the step sizes at the start of operation, and that the adaptive filter weights the step sizes based on a result of the addition.

It may be arranged that the adaptive filter adds a second vector to the result of the multiplication, the second vector determining initial weighting of the step sizes at the start of operation, and that the adaptive filter weights the step sizes based on a result of the addition.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings.

Figure 2:
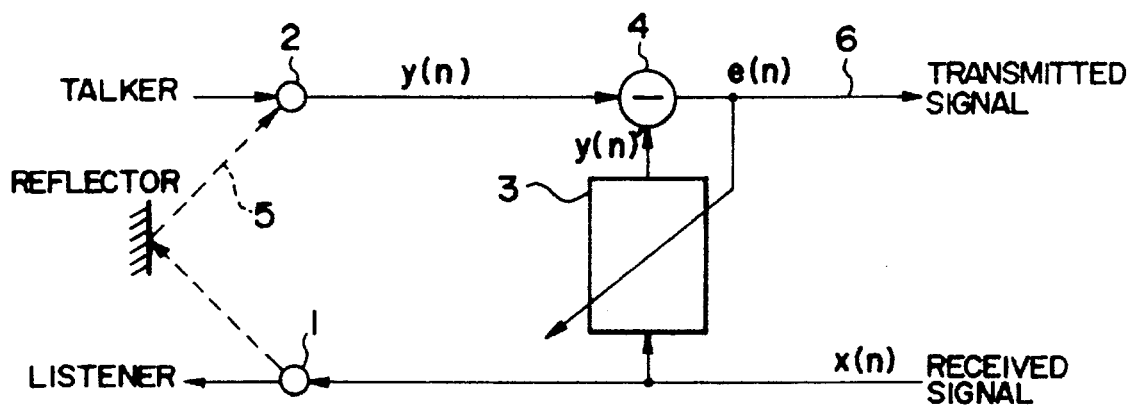
FIG. 2 is a functional diagram showing the acoustic echo canceller according to the preferred embodiment of the present invention.

FIG. 2 is a functional diagram of an acoustic echo canceller according to a preferred embodiment of the present invention. In the figure, the acoustic echo canceller includes a loudspeaker 1, a microphone 2, an adaptive filter 3 and a subtracter 4. When captured by the microphone 2, transmitting sound is fed to the subtracter 4 as a transmitting acoustic signal y(n). Since the microphone 2 also catches a reflected acoustic signal 5, that is, a received acoustic output signal outputted from the loudspeaker 1 and reflected from a reflector or a reflecting object, and the like, the transmitting acoustic signal y(n) also includes these signals as echo signals. A received signal x(n) is fed to the adaptive filter 3 and to the loudspeaker 1 where the received signal is outputted as sound.

The adaptive filter 3 updates filter coefficients using the received signal x(n) and an echo remainder signal e(n) fed from the subtracter 4 and produces an echo replica signal y'(n) for feeding to the subtracter 4. The subtracter 4 removes the echo replica signal y'(n) from the transmitting acoustic signal y(n) and outputs the echo remainder signal e(n) which is then transmitted and also fed to the adaptive filter 3 as a feedback signal.

Weighting of step sizes (feedback constants) of the coefficients of the adaptive filter 3 is performed by using a vector formed by absolute values of the tap coefficients of the adaptive filter 3. The adaptive algorithm of the coefficients can be expressed by the following equations:

vector $h(n+1)$=vector $h(n)$+$e(n)$•vector $\alpha^T(n)$•vector $x(n)$/$\|$vector $n(n)\|^2$     (1)

vector $\alpha(n)$=$\beta$•vector $A$+vector $p$     (2)

wherein vector $A$=$|hj(n)|(j=0$~$m)$, and $\beta$ is a scalar constant.

Vector x(n) represents a received signal vector. Vector hi(n) represents a tap coefficient vector of the adaptive filter 3. $\|$vector $x(n)\|^2$ represents a squared Euclidean norm of vector x(n). Vector $\alpha(n)$ represents a step size vector, which forms a characteristic feature of this preferred embodiment.

As can be appreciated from the foregoing equations (1) and (2), in this preferred embodiment, weighting of the step sizes is adaptively achieved using the vector A which is formed by the absolute values of the respective tap coefficients h0~hm.

Figure 3:
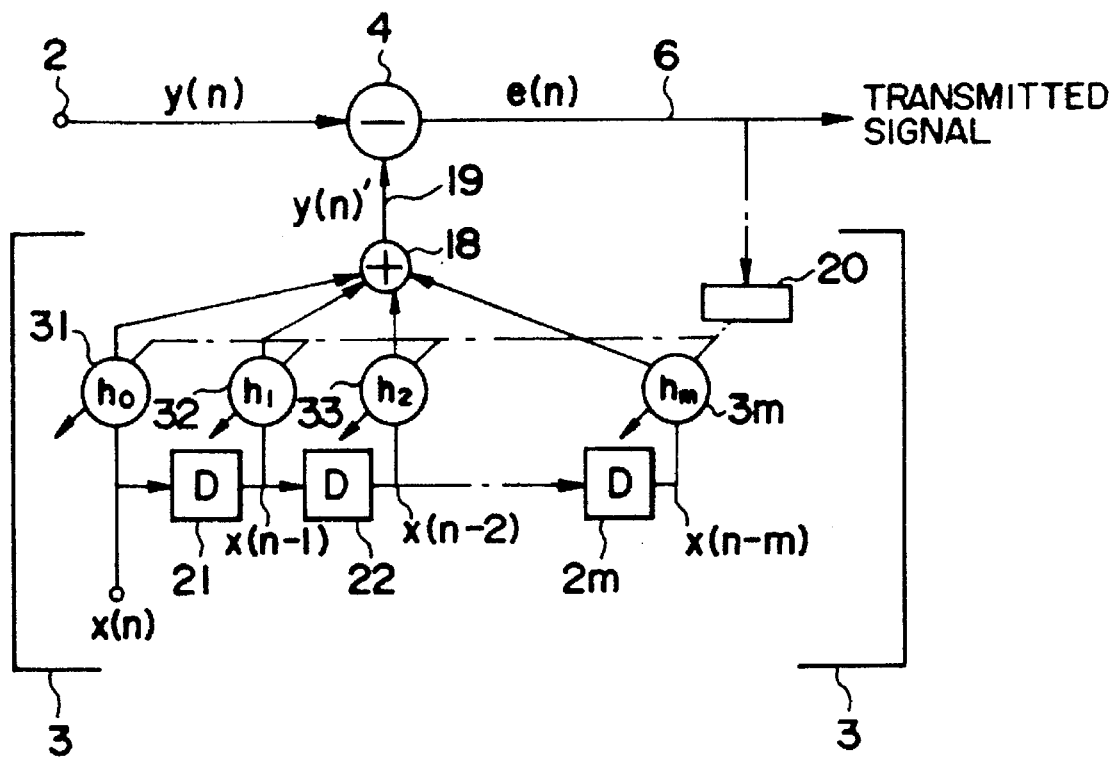
FIG. 3 is a functional diagram showing the adaptive filter according to the preferred embodiment of the present invention.

FIG. 3 is a functional diagram of the adaptive filter 3. In FIG. 3, the adaptive filter 3 is in the form of an FIR (finite impulse response) filter and includes unit delay circuits (D) 21~2m, tap coefficient registers 31~3m, an adder 18 and a tap coefficient updating circuit 20.

The received signal x(n) is fed to the unit delay circuit 21 and to the tap coefficient register 31. The received signal x(n) fed to the unit delay circuit 21 is delayed by unit time and fed to the next unit delay circuit 22, and is successively performed until the unit delay circuit 2m, each time delaying the received signal by unit time. A received signal x(n−1) outputted from the unit delay circuit 21 with unit time delay is fed to the tap coefficient register 32 and to the next unit delay circuit 22. The received signal x(n−1) fed to the unit delay circuit 22 is fed to the tap coefficient register 33 and to the next unit delay circuit 23 as a received signal x(n−2) after a unit time delay. Finally, a delayed received signal x(n-m) outputted from the unit delay circuit 2m is fed to the tap coefficient register 3m.

The tap coefficient updating circuit 20 derives new or updated tap coefficients h0~hm from the echo remainder signal e(n) and the received signal x(n) for feeding to the tap coefficient registers 31~3m. Updating of the tap coefficients is achieved based on the algorithm represented by the foregoing equations (1) and (2).

The tap coefficient registers 31~3m set the updated tap coefficients h0~hm given from the tap coefficient updating circuit 20 and multiply the received signals x(n)~x(n-m) by the updated tap coefficients, respectively, so as to feed the multiplication results to the adder 18. The adder 18 adds the multiplication results given from the tap coefficient registers 31~3m and feeds the addition result to the subtracter 4 as a new echo replica signal y'(n).

Figure 1:
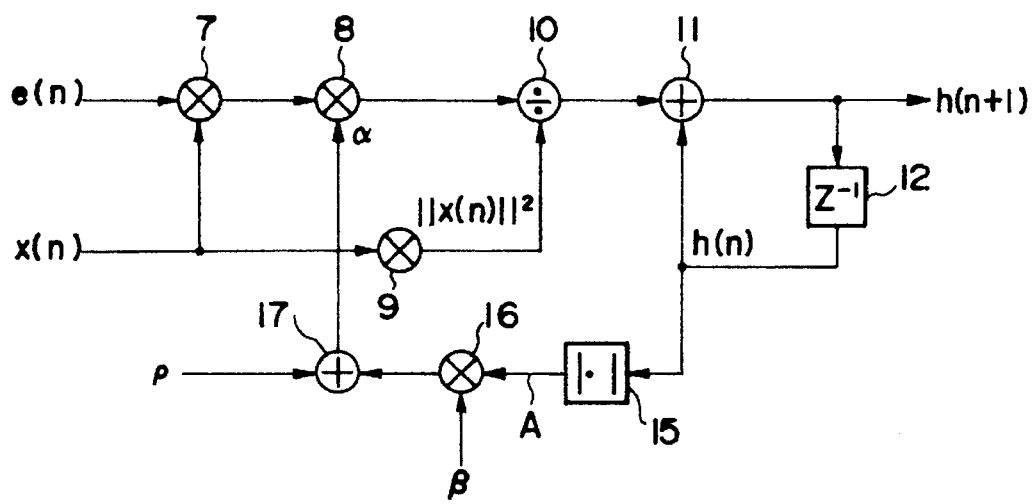
FIG. 1 is a functional diagram showing a tap coefficient updating circuit of an adaptive filter of an acoustic echo canceller according to a preferred embodiment of the present invention.

FIG. 1 is a functional diagram of the tap coefficient updating circuit 20 having the characteristic feature of this preferred embodiment. In FIG. 1, the tap coefficient updating circuit 20 includes multipliers 7, 8, 9 and 16, a divider 10, adders 11 and 17, a unit delay circuit ($Z^{-1}$) 12, and an absolute value calculator 15. With this arrangement, the tap coefficient updating circuit 20 performs the tap coefficient updating and the weighting of the step sizes of the tap coefficients h0~hm using the coefficients themselves based on the algorithm represented by the foregoing equations (1) and (2).

The echo remainder signal e(n) is fed to the multiplier 7 where it is multiplied by the received signal vector x(n). The multiplication result "e(n)•vector x(n)" is fed to the next multiplier 8. On the other hand, the vector A formed by the absolute values of the respective tap coefficients is derived from the tap coefficient vector h(n) at the absolute value calculator 15 and fed to the multiplier 16. At the multiplier 16, the vector A is multiplied by the scalar constant $\beta$. The multiplication result "$\beta$•vector A (vector A=$|hj(n)|(j=0$~$m))$" is fed to the adder 17. Since the scalar constant $\beta$ is a constant for giving a variation gradient necessary for the step sizes, a variation degree (gain) of the step size can be changed depending on a magnitude of $\beta$.

The adder 17 adds the multiplication result "$\beta$•vector A" from the multiplier 16 and the vector p and feeds the addition result "vector p+$\beta$•vector A" to the multiplier 8 as the step size vector $\alpha$. The vector p determines the step size vector $\alpha$ from the initial state to the start of operation and thus determines the echo canceling performance of the adaptive filter 3 at the start of operation. As appreciated, the weighting of the step size vector $\alpha(n)$ is adaptively performed using the absolute values of the respective tap coefficients h(n).

The multiplier 8 multiplies the multiplication result "e(n)•vector x(n)" by the step size vector $\alpha(n)$ and feeds the multiplication result "e(n)•vector $\alpha^T(n)$•vector x(n)" to the divider 10. On the other hand, the multiplier 9 squares the received signal vector x(n) to derive the squared Euclidean norm of vector x(n), that is, $\|$vector $x(n)\|^2$, and feeds it to the divider 10.

The divider 10 divides the multiplication result "e(n)•vector $\alpha^T(n)$•vector x(n)" from the multiplier 8 by $\|$vector x(n)‖² from the multiplier 9 and feeds the division result "e(n)•vector α$^T$(n)•vector x(n)/‖vector x(n)‖²" to the adder 11. The adder 11 adds the division result "e(n)•vector α$^T$(n)•vector x(n)/‖vector x(n)‖²" and the tap coefficient vector h(n) to derive the tap coefficient vector h(n+1) for the next sampling time (n+1) and feeds it to the unit delay circuit 12 and to the tap coefficient registers 31~3m.

Now, operations of the acoustic echo canceller of this preferred embodiment will be described hereinbelow.

At the initial state, since the tap coefficients h0~hm of the tap coefficient registers 31~3m of the adaptive filter 3 are 0, the acoustic echo canceller starts the adaptive filtering process with "step size vector α(n)=vector ρ" according to the learning identification method. Subsequently, due to presence of the transmitting acoustic signal y(n) and the received signal x(n), the process of updating the tap coefficients h0~hm is performed at the tap coefficient updating circuit 20. Then, updating magnitudes of the tap coefficients corresponding to a period where the acoustic echo exists are gradually increased according to the adaptive algorithm represented by the foregoing equations (1) and (2). Correspondingly to this, the step size vector α(n) is also increased. By setting β of the step size vector α(n) to be relatively large, the updating magnitudes can be increased.

In the foregoing manner, the correcting or updating speed of the tap coefficients set at the tap coefficient registers 31~3m becomes greater than the prior art. Accordingly, the optimum echo replica signal y'(n) can be quickly produced at the adder 18 by convolutional integration of the received signals x(n)~x(n−m) using the updated tap coefficients h0~hm and fed to the subtracter 4 so as to removed from the transmitting acoustic signal y(n).

On the other hand, in a period where no echo exists, the tap coefficients approximate 0 so that the step size vector α(n) approximates the vector ρ. Accordingly, it is preferable that the vector α is set to a small value.

According to the adaptive filter 3 of the foregoing preferred embodiment, the step size vector α(n) (=vector ρ+β•vector A) can be adaptively changed in proportion to magnitudes of the tap coefficients h0~hm of the adaptive filter 3 depending on an acoustic condition of the room which is variable. Thus, the tap coefficient updating can be achieved much faster than the conventional learning identification method. Further, since the tap coefficients for the next sampling time are derived using the vector formed by the absolute values of the tap coefficients immediately before, the step size vector can be derived with high accuracy, and thus the optimum tap coefficients can be derived. Thus, in the foregoing acoustic echo canceller, the convergence speed of the echo remainder signal can be rendered high. Further, even if the impulse response in the acoustic path changes, it can be fully dealt with.

Figure 4:
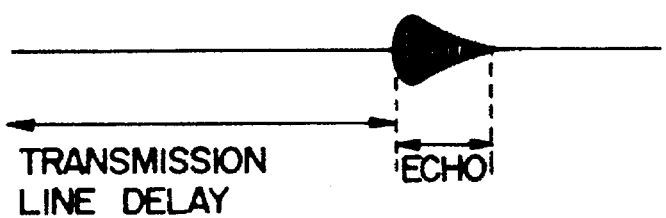
FIG. 4 is a diagram for explaining the state where a transmission line delay and an echo coexist.

Further, even in case of a line echo canceller as shown in FIG. 4, wherein a transmission line delay and the actual echo coexist, since tap coefficients corresponding to a period with no echo approximate 0, the step size vector α(n) can also approximate the vector ρ. As in the foregoing acoustic echo canceller, the convergence speed of the echo remainder signal can be rendered high.

In the foregoing preferred embodiment, the adaptive filter 3 is applied to the acoustic echo canceller or the line echo canceller. On the other hand, the adaptive filter 3 can also be applied to a noise canceller or an echo canceller of a data system to be used together with a modem or the like. Further, it may also be effectively applied to a television meeting apparatus, a voice meeting apparatus or the like.

It is preferable to set the number of taps of the adaptive filter 3 to be greater In the acoustic echo canceller than in the line echo canceller since echo time is longer in the acoustic echo canceller.

Further, the adaptive filter 3 can be applied not only to the FIR type, but also to an IIR (infinite impulse response) type or an FIR-IIR composite type.

Further, the LMS (least mean square) method, the RLS (recursive least square) method or the like may be used instead of the learning identification method for achieving the echo canceling.

As appreciated from the foregoing description, according to the foregoing adaptive filter, since the step sizes can be changed adaptively in proportion to magnitudes of the absolute values of the tap coefficients, the convergence of the tap coefficients can be faster with high accuracy as compared with the prior art. Further, according to the echo canceller Incorporating the Improved adaptive filter, since the convergence speed of the tap coefficients can be rendered high, even if echo waveform or echo time changes, the echo canceling can be achieved by updating the tap coefficients quickly.

As appreciated, in the line echo canceller, the adaptive filter estimates the echo replica signal for canceling the echo caused due to the signal transmission and coming through the transmission line. On the other hand, in the acoustic echo canceller, since the acoustic output generated due to the signal reception is captured as echo at the microphone of the transmission system, the adaptive filter estimates the echo replica signal for canceling such echo.

While the present invention has been described in terms of the preferred embodiments, the invention is not to be limited thereto, but can be embodied in various ways without departing from the principle of the invention as defined in the appended claims.

What is claimed is:

1. An adaptive filter in the form of one of an FIR filter and an IIR filter for performing an adaptive filtering process relative to an input signal using a plurality of tap coefficients, said adaptive filter comprising:

tap coefficient updating means including:

means for deriving a first vector formed by current absolute values of said plurality of tap coefficients; and means for weighting step sizes of said plurality of tap coefficients using said first vector and for deriving a plurality of new tap coefficients based on the weighted step sizes.

2. The adaptive filter according to claim 1, wherein said tap coefficient updating means multiplies said first vector by a given constant which determines an updating rate of said step sizes, said tap coefficient updating means weighting said step sizes based on a result of said multiplication.

3. The adaptive filter according to claim 2, wherein said tap coefficient updating means adds a second vector to the result of said multiplication, said second vector determining initial weighting of said step sizes at the start of operation, and wherein said tap coefficient updating means weights said step sizes based on a result of said addition.

4. The adaptive filter according to claim 1, wherein said tap coefficient updating means adds a second vector to said first vector, said second vector determining initial weighting of said step sizes at the start of operation, and wherein said tap coefficient updating means weights said step sizes based on a result of said addition.

5. An echo canceller comprising:

an adaptive filter in the form of one of an FIR filter and an IIR filter for performing an adaptive filtering process relative to an input signal using a plurality of tap coefficients, said adaptive filter estimating an echo caused due to one of signal transmission and signal reception so as to output an echo replica signal: and removing means for removing said echo replica signal from said input signal so as to output a remainder signal, wherein said adaptive filter derives a first vector formed by current absolute values of said plurality of tap coefficients and weights step sizes of said plurality of tap coefficients using said first vector, and wherein said adaptive filter updates said plurality of tap coefficients using said remainder signal and said step sizes weighted so as to correct said echo replica signal.

6. The echo canceller according to claim 5, wherein said adaptive filter multiplies said first vector by a given constant which determines an updating rate of said step sizes, and wherein said adaptive filter weights said step sizes based on a result of said multiplication.

7. The echo canceller according to claim 6, wherein said adaptive filter adds a second vector to the result of said multiplication, said second vector determining initial weighting of said step sizes at the start of operation, and wherein said adaptive filter weights said step sizes based on a result of said addition.

8. The echo canceller according to claim 5, wherein said adaptive filter adds a second vector to said first vector, said second vector determining initial weighting of said step sizes at the start of operation, and wherein said adaptive filter weights said step sizes based on a result of said addition.

9. An adaptive filter, comprising:

means for adaptively filtering an input signal using a plurality of tap coefficients;

tap coefficient updating means that repeatedly updates m+1 current tap coefficients $h_j(n)$, j=0 to m, to m+1 updated tap coefficients $h_j(n+1)$, j=0 to m, where n is an integer designating an n-th update, including:

means for deriving a first vector $A=|h_j(n)|j=0$ to m, formed by absolute values $|h_j(n)|$ of the m+1 current tap coefficients, and means for weighting step sizes of the plurality of tap coefficients using the first vector A and for deriving the m+1 new tap coefficients $h_j(n+1)$, j=1 to m, based on the weighted step sizes.

10. An adaptive filter according to claim 9, wherein said weighting and deriving means include:

means for generating a step size vector $\alpha(n)$ by multiplying the first vector A by a scalar constant $\beta$ and adding thereto a vector p that represents an initial value of a step size vector $\alpha(n)$ which is vector $\alpha(0)$; and means for generating a vector h (n+1) according to the following equation:

vector $h(n+1)$=vector $h(n)+e(n)$•vector $\alpha^T(n)$•vector $x(n)/\|$vector $x(n)\|^2$, wherein vector h(n) includes as vector elements the tap coefficients $h_j$ (n+1), j=0 to m, e(n) is an echo remainder signal and vector x(n) is a received signal vector.

* * * * *